(12) United States Patent
Hellstrom et al.

(10) Patent No.: US 11,884,044 B2
(45) Date of Patent: Jan. 30, 2024

(54) PROCESS FOR PRODUCING A MULTILAYER LAMINATE

(71) Applicant: BOREALIS AG, Vienna (AT)

(72) Inventors: Stefan Hellstrom, Stenungsund (SE); Francis Costa, Linz (AT); Jeroen Oderkerk, Stenungsund (SE); Bert Broeders, Beringen (BE)

(73) Assignee: BOREALIS AG, Vienna (AT)

( * ) Notice: Subject to any disclaimer, the term of this patent is extended or adjusted under 35 U.S.C. 154(b) by 0 days.

(21) Appl. No.: 17/042,992

(22) PCT Filed: Apr. 8, 2019

(86) PCT No.: PCT/EP2019/058810
§ 371 (c)(1),
(2) Date: Sep. 29, 2020

(87) PCT Pub. No.: WO2019/201646
PCT Pub. Date: Oct. 24, 2019

(65) Prior Publication Data
US 2021/0023831 A1    Jan. 28, 2021

(30) Foreign Application Priority Data

Apr. 16, 2018  (CN) .......................... 201820538314.0
Apr. 16, 2018  (EP) ..................................... 18167590

(51) Int. Cl.
*B32B 27/32* (2006.01)
*B32B 27/30* (2006.01)
(Continued)

(52) U.S. Cl.
CPC ........ *B32B 27/32* (2013.01); *B32B 17/10036* (2013.01); *B32B 27/18* (2013.01); *B32B 27/308* (2013.01); *B32B 37/1054* (2013.01);
*H01L 31/049* (2014.12); *H01L 31/0488* (2013.01); *B32B 2250/03* (2013.01); *B32B 2250/05* (2013.01); *B32B 2250/40* (2013.01); *B32B 2309/02* (2013.01); *B32B 2309/105* (2013.01);
(Continued)

(58) Field of Classification Search
CPC ........ B32B 27/32; B32B 27/30; B32B 27/18; B32B 17/10; B32B 37/10; H01L 31/048; H01L 31/049
USPC ........................................................ 428/220
See application file for complete search history.

(56) References Cited

U.S. PATENT DOCUMENTS

| 2010/0147443 A1 | 6/2010 | Utesch et al. |
| 2013/0005071 A1* | 1/2013 | Hiraike .................... C09K 3/10 438/73 |

FOREIGN PATENT DOCUMENTS

| CN | 201950909 U | 8/2011 |
| CN | 103068575 A | 4/2013 |

(Continued)

OTHER PUBLICATIONS

Partial European Search Report dated Sep. 24, 2018.
(Continued)

*Primary Examiner* — Tahseen Khan
(74) *Attorney, Agent, or Firm* — TAROLLI, SUNDHEIM, COVELL & TUMMINO L.L.P.

(57) ABSTRACT

The present invention relates to a lamination process for producing a multilayer laminate, preferably to a lamination process for producing a photovoltaic (PV) module, and to a PV module laminate.

16 Claims, 1 Drawing Sheet

Figure 1:
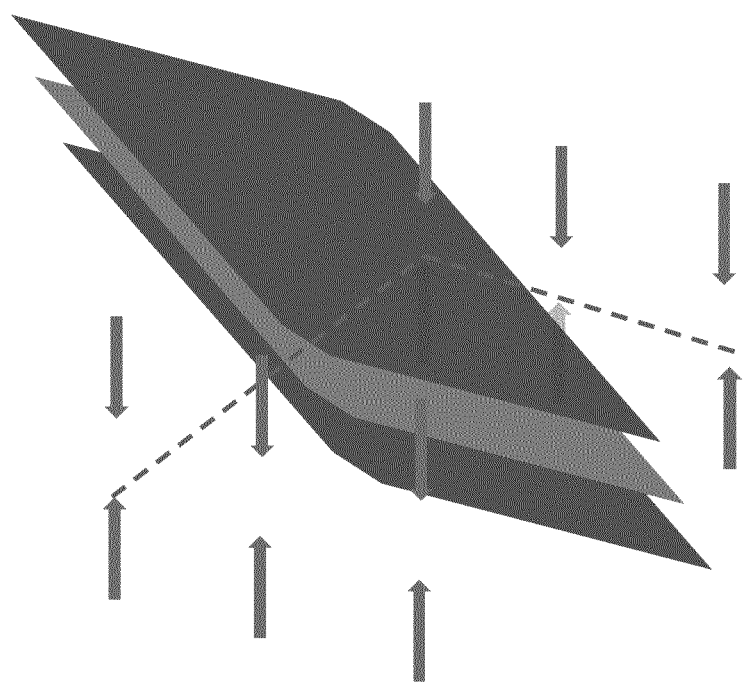

(51) Int. Cl.
  *B32B 27/18* (2006.01)
  *B32B 17/10* (2006.01)
  *B32B 3/10* (2006.01)
  *H01L 31/048* (2014.01)
  *H01L 31/049* (2014.01)
  *B32B 37/10* (2006.01)

(52) U.S. Cl.
  CPC ....... *B32B 2309/12* (2013.01); *B32B 2315/08* (2013.01); *B32B 2323/04* (2013.01); *B32B 2333/08* (2013.01); *B32B 2457/12* (2013.01)

(56) References Cited

FOREIGN PATENT DOCUMENTS

| | | | | |
|---|---|---|---|---|
| EP | 0736065 | B1 | 10/1996 | |
| EP | 1309631 | B1 | 5/2003 | |
| EP | 1309632 | B1 | 5/2003 | |
| EP | 2144301 | B1 | 1/2010 | |
| GB | 1116739 | | 7/1968 | |
| JP | 201358276 | A | 12/2013 | |
| TW | 201532823 | A | 12/2014 | |
| TW | 201631003 | A | 9/2016 | |
| WO | 2013118361 | A1 | 8/2001 | |
| WO | 2009113643 | A1 | 9/2009 | |
| WO | 2010/124189 | A1 | 10/2010 | |
| WO | 2011/160964 | A1 | 12/2011 | |
| WO | 2012005367 | A1 | 1/2012 | |
| WO | 2016041946 | A1 | 3/2016 | |
| WO | WO-2016041946 | A1 * | 3/2016 | ........... C08K 5/3435 |
| WO | 2017/076628 | A1 | 5/2017 | |
| WO | 2017076629 | A1 | 5/2017 | |
| WO | WO-2017076628 | A1 * | 5/2017 | ........... C08F 210/02 |
| WO | 2018/013324 | A1 | 1/2018 | |
| WO | 2018011324 | A1 | 1/2018 | |
| WO | WO-2018011324 | A1 * | 1/2018 | ........... B32B 15/08 |

OTHER PUBLICATIONS

Corrected European Search Report dated Feb. 7, 2019.
Definition of Terms relating to the Non-Ultimate Mechanical Properties of Polymers, Pur & Appl. Chem., vol. 70, No. 3, pp. 701-754, 1998.
European Extended Search Report dated Jan. 4, 2019.
Encyclopedia of Materials Science and Technology 2001 Elsevier Science Ltd. pp. 7181-7184.
Encyclopedia of Polymer Science and Engineering vol. 6.
Taiwanese Office Action dated Mar. 5, 2020.
Heino, Eeva-Leena Heino, "The Influence of moleculor structure on some rheological properties of polyethylene" Annual Transaction of the Nordic Rheology Society, vol. 3, 1995.
Heino, E-L., et al., "Rheological Characterizatoin of Polethylene Fractions", Theoretical and Applied Rheology, Aug. 17-21, 1992.
Perret-Aebi, et al., "Insights on Eva Lamination Process: Where do the Bubbles Come From", 25th European Photovoltaic Solar Energy Conference and Exhibition/5th World Conference on Photovoltaic Energy Conversion, Sep. 6-10, 2010, Valencia, Spain.
Randall, J., "A Review of High Resolution Liquid 13carbon Nuclear Magnetic Resonance Characterizations of Ethylene-Based Polymers" Rev. Macromol. Chem. Phys., C29(2 & 3), 201-317 (1989).
Japanese Patent Application No. 2020-546435; Notice of Reasons for Rejection dated Nov. 16, 2021; 9 pgs.
Applicant: Borealis AG; "A Process for Producing a Multilayer Laminate"; Chinese Application No. 201980023702.2; Chinese First Office Action dated Jan. 13, 2022; 26 pgs.
Japanese Patent Application No. 2020-546435; Japanese Notice of Reasons for Rejection dated May 24, 2022; 12 pgs.
Applicant: Borealis AG; "A Process for Producing a Multilayer Laminate"; Chinese Application No. 201980023702.2; Office Action—Decision of Rejection; dated Sep. 15, 2022; 15 pgs.
Production Technology of Friction Materials, edited by Yu Zhanjiang and Wang Xiaofang, Tianjin University Press, published on Jan. 31, 2018, pp. 102-103.

* cited by examiner

PROCESS FOR PRODUCING A MULTILAYER LAMINATE

The present invention relates to a lamination process for producing a multilayer laminate, preferably to a lamination process for producing a photovoltaic (PV) module, and to a PV module laminate.

BACKGROUND

Lamination of polymer layers on a rigid or flexible substrate of various materials is a well known technology and used in numerous technical fields. The polymer material used for the polymer layer can vary depending on the end application of the article comprising the multilayer laminate. For instance ethylene vinyl acetate (EVA) and other thermoplastic based polymers are conventionally used layer materials in lamination processes.

In general, the lamination of layer(s) to a substrate can be performed for instance by 1) so called cast extrusion, wherein at least part of the layers are produced on a premade substrate during the cast extrusion step or 2) by integrating premade substrate and premade layer(s) together under heat and pressure, typically in a vacuum in a laminator equipment.

For instance, lamination is one of the steps also used for producing well known photovoltaic modules, also known as solar cell modules. Photovoltaic (PV) modules produce electricity from light and are used in various kind of applications as well known in the field. The type of the photovoltaic module can vary. The modules have typically a multilayer structure, i.e. several different layer elements which have different functions. The layer elements of the photovoltaic module can vary with respect to layer materials and layer structure. The final photovoltaic module can be rigid or flexible.

The rigid photovoltaic module can for example contain a rigid protective front layer element, such as a glass element, front encapsulation layer element, a photovoltaic element, rear encapsulation layer element, a protective back layer element, which is also called a backsheet layer element and which can be rigid or flexible; and optionally e.g. an aluminium frame.

In flexible modules all the above elements are flexible, whereby the protective front layer element can be e.g. a fluorinated layer made from polyvinylfluoride (PVF) or polyvinylidenefluoride (PVDF) polymer, and the backsheet layer element is typically a polymeric layer element (LE).

The above exemplified layer elements can be monolayer or multilayer elements.

All said terms have a well-known meaning in the art.

The state of the art encapsulation layers in flexible and rigid PV modules are typically made from ethylene vinyl acetate (EVA).

Moreover, there may be adhesive layer(s) between the layers of an element or between the different layer elements.

During the production of the PV module two or more premade elements of the PV module, which elements can be monolayer or multilayer elements are conventionally laminated together in a laminator equipment. Such lamination process normally comprises a step of heating the system, which heating step typically involves evacuation of air from the system, and a step pressurizing the system under heat and vacuum for the lamination to occur between the functionally different layer elements. In case of a PV multilayer element, the multilayer element, e.g. backsheet multilayer element, can be premade completely or partly before lamination to a different functional element, like rear encapsulation element.

Some end applications of laminated articles, like PV modules, bring demanding restrictions to the lamination process. E.g. in case of lamination process of layer elements of a PV module, it is always recommended that the application of pressure should be started only when the encapsulant layer reaches a temperature greater than its melting temperature and also after sufficient time that it is properly melted. This is very important as otherwise applying the pressure on insufficiently molten polymer or very close to its melting temperature will exert large stress on the fragile cells of the photovoltaic element causing their rupture.

In a lamination process using conventional laminator equipments, one very important and critical parameter for article manufacturers, like photovoltaic module manufacturers, is the lamination cycle time. The lamination cycle time has a marked impact on the expansion of production capacity and on the reduction of the production variable costs of a multilayer laminate, like PV module. Therefore there has been a constant attempt to develop various measures along the production value chain of a laminated article, like PV module, which could eventually result in shorter cycle time during lamination step.

Another critical parameter is the quality of the final multilayer laminate, like PV module, in order to provide desired end application performance and sufficient end use life.

Many conventional polymer materials used for the polymeric layer element(s) require high pressure, like 1000 mbar, at pressing step to provide proper lamination to occur or high lamination temperatures to provide the polymer melt which can be laminated to substrate under the pressure. During lamination of polymeric layer elements on rigid substrate, like glass, for producing a multilayer laminate, like a glass-glass PV module, conventionally a high pressure (like ~800-1000 mbar) is generated in the laminator. The high pressure often bends the glass causing so called edge pinching in the obtained laminate. This means that the thickness of the laminate, particularly the thickness of the polymeric layer(s) of the laminate, varies considerably and is typically the thinnest at the corners of e.g. rectangular laminate, like PV module, where the pressure comes from two sides. Moreover, when the laminates are allowed to cool down after lamination in conventional pressures, oftentimes bubbles or delamination spots are found in the polymeric layer(s) of the laminate, like in the encapsulant layer(s) of a PV module bubbles or delamination spots around the interconnectors close to the edges of said laminate. Said delaminations can be further progressed during damp-heat exposure (85° C./85% relative humidity). The thickness variation, bubbles and/or delamination of the polymeric layer element(s) are of concern of quality of the laminate and may have an adverse effect on performance of the laminate at end use application and also on life cycle of the end use application.

WO2010124189 of Bemis Associates describes an encapsulation layer based on a blend of terpolymer of ethylene with acrylate and glycidyl methacrylate comonomers together with a heat resistant copolymer (ethylene with glycidyl methacrylate comonomer). The blend may also comprise carrier polymer which is an ethylene polymer modified (copolymerized or grafted) with silane. The formed layer can be crosslinked by irradiation. Also a lamination process has been described, in the experimental part, page 18 and 19, wherein the lamination is performed at pressure of about 1 atm (1013 mbar).

EP2144301 of Borealis discloses the possibility to reduce lamination temperature in relation to laminating of crosslinked ethylene copolymer with silane and optionally with acrylate comonomer(s). On p. 7, the temperature, pressure and total lamination time of the lamination process has been indicated. According to EP document pressure during lamination is below 2 bar, preferably below 1 bar (1000 mbar).

There is a continuous need to develop further lamination process solutions for producing a multilayer laminates, like photovoltaic modules, to meet the quality and performance demands required by the multilayer laminate, like PV module, producers in the further developing lamination industry, such as in the growing PV module industry.

FIGURES

FIG. 1 Demonstrates the measurement points for calculation average thickness variation based on the thickness variation at two opposite edges of a multilayer laminate. FIG. 1 illustrates a cross-section of two opposite edges in one embodiment of multilayer laminate comprising a polymeric layer element (LE) between first and second substrate elements. The arrows shows the three different measurement points to measure the thickness along the two opposite edges of said multilayer laminate to define the average thickness variation of the laminate as described under "Determination methods".

Figure 2:
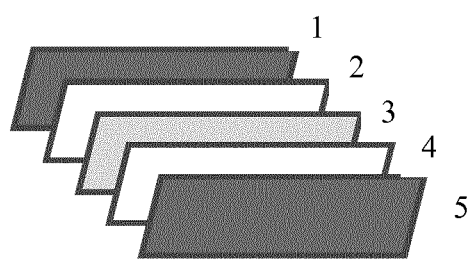

FIG. 2 illustrates the layer elements (separated) of a preferable multilayer laminate of the invention, namely of a photovoltaic (PV) module, comprising a protective front layer element (1), a front encapsulation layer element (2), a photovoltaic element (3), a rear encapsulation layer element (4) and a protective back layer element (5).

DESCRIPTION OF THE INVENTION

The present invention is thus directed to a process for producing a multilayer laminate which comprises at least one substrate element and at least one polymeric layer element (LE), wherein the polymeric layer element (LE) comprises a polymer composition comprising:

(a) a polymer;

and wherein the process comprises the steps of:

(i) assembling step to arrange the at least one substrate element and the at least one polymeric layer element (LE) in form of a multilayer assembly;

(ii) heating step to heat up the multilayer assembly optionally in a chamber at evacuating conditions;

(iii) pressure build up step, where the pressure on the multilayer assembly is gradually increased in a single or multiple steps;

(iv) pressure holding step, where the pressure is kept on the multilayer assembly at the heated conditions for the lamination of the assembly to occur; and (v) recovering step to cool and remove the obtained multilayer laminate for later use;

wherein the pressure during pressure holding step (iv) is kept at 790 mbar or below.

The process of the invention for producing a multilayer laminate as defined above, below or in claims is referred herein also shortly as "lamination process".

The at least one polymeric layer element (LE) of the multilayer laminate of the lamination process, which comprises the polymer composition comprising a polymer (a), as defined above, below or in claims, is referred herein also shortly as "polymeric layer element (LE)", "polymeric layer element", "polymeric layer (LE)", "polymeric layer", "polymeric layer (LE)" or "layer element (LE)".

The polymer composition comprising a polymer (a), as defined above, below or in claims, is referred herein also shortly as "polymer composition of the invention" or "polymer composition".

The polymer (a), as defined above, below or in claims with preferred embodiments, is referred herein also shortly as "polymer (a)".

The multilayer laminate of the lamination process which comprises the at least one substrate element and the at least one polymeric layer element (LE), as defined above, below or in claims, is referred herein also shortly as "laminate".

The pressure as given in pressure build up step (iii) and pressure holding step (iv) means herein that the pressure subjected on multilayer assembly, which pressure can be monitored and controlled, adjusted as desired, during the lamination process.

Accordingly, the lamination process of the invention relates to the earlier mentioned lamination by integrating premade substrate and premade layer(s) together under heat and pressure, optionally in a vacuum in a laminator equipment.

The substrate element means herein a premade layer element which can be a monolayer element or a multilayer element. The substrate element can be polymeric or non-polymeric and flexible or rigid element, depending on the desired end application. Example of non-polymeric and rigid substrate element is e.g. a glass layer element. Polymeric substrate element comprises a polymeric layer(s). If the polymeric substrate element is a multilayer element, then the multilayer element may be rigid or flexible and may consist of polymeric layers or polymeric and non-polymeric layers, like glass layer element.

"At least one" means herein "one or more".

"Rigid" means herein that the element is stiff and cannot be bended in a manner as flexible elements, and if bended, then typically the integrity of the rigid element typically breaks easily causing permanent fractures, as is not the case with flexible element. A skilled person can easily differentiate a rigid and flexible layer element.

The polymeric layer element (LE) means herein a premade layer element which is a polymeric monolayer element or a polymeric layer of a multilayer element. In case of such monolayer element, the monolayer element comprises, preferably consists of, the polymer composition of the invention. In case of such multilayer element, then the at least one polymeric layer element (LE) thereof comprises, preferably consists of, the polymer composition of the invention. Moreover, in case of polymeric multilayer element, at least one of the outer layer, preferably one or both of the outer layer(s), of the polymeric multilayer element comprise(s) a polymeric material as the major component of the layer material.

It has been surprisingly found that a polymeric layer comprising a polymer composition, as defined above, below or in claims, can be laminated on a substrate element(s) using the claimed pressure during the pressure build up step (iii) and the pressure holding step (iv) of the lamination process, which pressure is markedly lower than conventionally used pressure and which lower pressure results in a laminate with unexpectedly less thickness variation along the edges of the polymeric layer element (LE) of the laminate while maintaining advantageous adhesion of the final laminate.

Herein said less thickness variation is expressed as average thickness variation (%) which means average of the thickness variation of two opposite edges of the multilayer laminate as defined and calculated from the measurement points shown in FIG. 1 and with the formula as given under "Determination methods". The average thickness variation can be calculated from any two opposite edges of e.g. a rectangular multilayer laminate.

Moreover, the undesired flow-out of the polymeric material outside glass edges during the lamination process can preferably be decreased or even prevented.

Accordingly, undesired edge pinching occurring in the multilayer laminates of the state art can be reduced or even prevented with the lamination process of the invention.

Moreover, when laminating the polymeric layer element(s) (LE) optionally with other layer element(s) on at least one substrate element, preferably between a first substrate element and a second substrate element, like between two glass substrate elements, to produce a glass-glass laminate, like a preferable glass-glass photovoltaic (PV) module wherein the polymeric layer element of the invention is e.g. encapsulant layer element(s), using the claimed pressure as defined above, below or in claims, then a final multilayer laminate with less internal stresses can be achieved.

Moreover, the conventional drawback of delamination areas in the final laminate can be significantly reduced or even prevented when examining visually after the lamination and after 625 h exposure to damp-heat at temperature of 85° C. and at relative humidity of 85% (RH)).

Moreover, the conventional drawback of bubble formation in the final laminate can be significantly reduced or even prevented when examining visually after the lamination and after 625 h exposure to damp-heat at temperature of 85° C. and at relative humidity of 85% (RH)).

As a result the quality of the obtained multilayer laminate is improved i.a. in terms of evenness of the polymeric layer element (less pinching), preferably less internal stresses and/or preferably less delamination and bubble formation, which improvement(s) contribute to the performance and use life of the laminate at end use environment thereof.

Preferably the lamination process of the invention also enables, if desired, shorter lamination cycle time compared to prior art lamination processes, while using e.g. conventional lamination equipment.

Naturally, in the lamination process of the invention, a laminate can be produced which comprises more than one substrate element and more than one polymeric layer element (LE). Furthermore, a laminate can comprise other layer elements, which are same or different form said substrate element and polymeric layer element (LE) and which can be polymeric or non-polymeric.

The term "polymeric" means herein that the polymeric layer element (LE) comprises at least 50 wt %, preferably at least 80%, of polymer (a) or a mixture of polymer (a) with other optional polymer(s). More preferably, the polymer composition of the polymeric layer element (LE), most preferably of the polymeric layer element (LE), comprises polymer (a) as the main polymeric component, preferably consists of the polymer (a) as the polymeric component. I.e. in this most preferable embodiment polymer (a) is the only polymeric component as defined later below in more detailed description.

In a preferable embodiment said at least one substrate element is adjacent to said at least one polymeric layer element (LE).

The term "adjacent" means herein that said substrate element and the polymeric layer comprising the polymer composition are facing at each other. In some embodiments there can be an adhesive layer between the substrate and polymeric layer element (LE)s. Such adhesive layers has the function to improve the adhesion between the two elements and have a well known meaning in the lamination field. Preferably, there are no adhesive layer between the substrate and polymeric layer element (LE)s, i.e. the substrate element and polymeric layer element (LE) are in direct contact to each other.

In one preferable embodiment, the multilayer laminate comprises a first substrate element, at least one polymeric layer element (LE) and a second substrate element.

The invention further provides a process for producing a multilayer laminate of the invention.

In a preferable embodiment the lamination process of the invention, an article, preferably a multilayer laminate which comprises one or more polymeric layer element(s) (LE) and optionally other layer element(s) between said at least one substrate and a second substrate element, more preferably a photovoltaic (PV) module, is produced. Accordingly, the process is preferably a process as defined above, below or in claims for producing a photovoltaic (PV) module laminate comprising, in the given order, a protective front layer element, a front encapsulation layer element, a photovoltaic element, a rear encapsulation layer element and a protective back layer element; wherein at least one of the front encapsulation layer element or the rear encapsulation layer element, or both the front encapsulation layer element and the rear encapsulation layer element, comprise(s) a polymer composition comprising:

(a) a polymer, and wherein the process comprises the steps of:

(i) assembling step to arrange the protective front layer element, the front encapsulation layer element, the photovoltaic element, the rear encapsulation layer element and the protective back layer element, in given order, to form of a photovoltaic module assembly;

(ii) heating step to heat up the photovoltaic module assembly optionally in a chamber at evacuating conditions;

(iii) pressure build up step, where the pressure on the multilayer assembly is gradually increased in a single or multiple steps;

(iv) pressure holding step, where the pressure is kept on the multilayer assembly at the heated conditions for the lamination of the assembly to occur; and (v) recovering step to cool and remove the obtained multilayer laminate for later use;

wherein the pressure during pressure holding step (iv) is kept at 790 mbar or below.

The invention further provides an article, preferably a multilayer laminate, preferably a photovoltaic (PV) module obtainable by, preferably produced by, the process of the invention. More preferably, the invention further provides an article, preferably a multilayer laminate, preferably a photovoltaic (PV) module the process of the invention.

The following preferable embodiments, properties and subgroups of the lamination process, including the process for producing a multilayer laminate, preferably a PV module; the polymeric layer element (LE), the polymer (a) and silane group(s) containing units (b) thereof as well as the PV module laminate, are independently generalisable so that they can be used in any order or combination to further define the suitable embodiments of the invention.

Polymer Composition of the at Least One Polymeric Layer of the Multilayer Laminate and Polymer (a)

The polymer composition of the polymeric layer of the lamination process preferably comprises a polymer (a) which is a thermoplastic polymer.

The term "thermoplastic polymer" has a well known meaning in the polymer field. A thermoplastic polymer is defined herein as a type of polymer that changes properties when heated and cooled. Thermoplastic polymers get soften while heating and can be reshaped in different shapes; and when cooled after heating, thermoplastic polymers solidify to shaped form.

Conventional polymeric layer materials may require crosslinking during the lamination process. In such case high lamination pressures are required to suppress bubble formation caused gaseous by-products formed from peroxide reaction (L.-E. Perret-Aebi et al., INSIGHTS ON EVA LAMINATION PROCESS: WHERE DO THE BUBBLES COME FROM?, 25th European Photovoltaic Solar Energy Conference and Exhibition/5th World Conference on Photovoltaic Energy Conversion, 6-10 Sep. 2010, Valencia, Spain).

The lamination process of the invention is highly suitable for polymeric materials which do not require crosslinking with peroxide during the lamination process. In one embodiment of the process, the polymer (a) of the polymer composition, preferably the polymer (a) is preferably not crosslinked with peroxide during the lamination process. As a result, the process of the invention enables to reduce or avoid the bubble formation from gaseous by-products of peroxide.

Thus preferably the polymer (a) is non-peroxide crosslinked. Preferably, the polymer (a) is a thermoplastic polymer which is not crosslinked with peroxide during the lamination process. Moreover, this embodiment of the lamination process of the invention also contributes, if desired, to the shorter lamination cycle time compared to prior art lamination processes, while using e.g. conventional lamination equipment.

In another preferable embodiment the polymer (a) of the polymer composition is a polyethylene polymer. Preferably a polyethylene copolymer with one or more comonomers.

As well known "comonomer" refers to copolymerisable comonomer units.

It is preferred that the comonomer(s) of polymer (a), if present, is/are other than vinyl acetate comonomer. Preferably, the polymeric layer is without (does not comprise) a copolymer of ethylene with vinyl acetate comonomer.

It is preferred that the comonomer(s) of polymer (a), if present, is/are other than glycidyl methacrylate comonomer. Preferably, the polymeric layer is without, i.e. does not comprise, a copolymer of ethylene with acrylate and glycidyl methacrylate comonomers.

The polymer composition of the polymeric layer of the lamination process preferably comprises a polymer (a) selected from:
  (a1) a polymer of ethylene which optionally contains one or more comonomer(s) other than a polar comonomer of polymer (a2) and which bears functional groups containing units;
  (a2) a polymer of ethylene containing one or more polar comonomer(s) selected from (C1-C6)-alkyl acrylate or (C1-C6)-alkyl (C1-C6)-alkylacrylate comonomer(s), and optionally bears functional group(s) containing units other than said polar comonomer; or
  (a3) a polymer of ethylene containing one or more alpha-olefin comonomer selected from (C1-C10)-alpha-olefin comonomer; and optionally bears functional group(s) containing units; and silane group(s) containing units (b).

The functional groups containing units of the polymer (a1) are other than said optional comonomer(s).

Accordingly, in this preferable embodiment silane group(s) containing units (b) are always in combination with polymer (a) and with the preferable embodiments thereof.

The definition (a1) a polymer of ethylene which bears silane group(s) containing comonomer, as defined above, below or in claims, is referred herein also shortly as "polymer of ethylene (a1)" or "polymer (a1)".

The definition (a2) a copolymer of ethylene with one or more polar comonomer(s) selected from (C1-C6)-alkyl acrylate or (C1-C6)-alkyl (C1-C6)-alkylacrylate comonomer(s), which copolymer (a2) bears silane group(s) containing units and which copolymer (a2) is different from the polymer of ethylene (a1), as defined above, below or in claims, is referred herein also shortly as "copolymer of ethylene (a2)", "copolymer (a2)" or "polymer (a2)".

The definition (a3) a copolymer of ethylene with one or more (C1-C10)-alpha-olefin comonomer which is different from polymer of ethylene (a1) and polymer of ethylene (a2), as defined above, below or in claims, is referred herein also shortly as "polymer (a3)".

The silane group(s) containing units (b) and the polymer (a) can be present as a separate components, i.e. as blend (composition), in the polymer composition of the polymeric layer of the invention, or the silane group(s) containing units (b) can be present as a comonomer of the polymer (a) or as a compound grafted chemically to the polymer (a). In general, copolymerisation and grafting of the silane group(s) containing units to ethylene are well known techniques and well documented in the polymer field and within the skills of a skilled person.

In case of a blend, the silane group(s) containing units (b) component (compound) may, at least partly, be reacted chemically with the polymer (a), e.g. grafted to polymer (a) backbone, using optionally e.g. a radical forming agent, such as peroxide. Such chemical reaction would conventionally take place before or during the lamination process of the the invention.

Preferably the silane group(s) containing units (b) are present (bonded) in the backbone of the polymer (a), when the premade polymeric layer element is introduced to the assembling step (i) of the lamination process of the invention.

More preferably, the polymer (a) bears functional group(s) containing units, whereby said functional group(s) containing units are said silane group(s) containing units (b). In this embodiment the silane group(s) containing units (b) can be copolymerised or grafted to the polymer (a). The silane group(s) containing units (b) as the optional, and preferable, functional group(s) containing units are preferably present in said polymer (a) in form of comonomer units or in form of grafted compound.

Accordingly, in case of silane group(s) containing units (b) are incorporated to the polymer (a) as a comonomer, the silane group(s) containing units (b) are copolymerized as comonomer with ethylene monomer during the polymerization process of polymer (a). In case the silane group(s) containing units (b) are incorporated to the polymer by grafting, the silane group(s) containing units are reacted chemically (also called as grafting), with the polymer (a) after the polymerization of the polymer (a). The chemical reaction, i.e. grafting, is performed typically using a radical forming agent such as peroxide. Such chemical reaction may take place before or during the lamination process of the invention. In general, copolymerisation and grafting of the silane group(s) containing units to ethylene are well known techniques and well documented in the polymer field and within the skills of a skilled person.

It is also well known that the use of peroxide in the grafting embodiment decreases the melt flow rate (MFR) of an ethylene polymer due to a simultaneous crosslinking reaction. As a result, the grafting embodiment can bring limitation to the choice of the MFR of polymer (a) as a starting polymer, which choice of MFR can have an adverse impact on the quality of the polymer at the end use application. Furthermore, the by-products formed from peroxide during the grafting process can have an adverse impact on use life of the polymer composition at end use application.

Thus most preferably, the silane group(s) containing units (b) are present in polymer (a) as a comonomer. I.e. in case of polymer (a1) the silane group(s) containing units (b) are copolymerised as a comonomer together with the ethylene monomer during the polymerisation process of the polymer (a1). And in case of the polymer (a2) the silane group(s) containing units (b) are copolymerised as a comonomer together with the polar comonomer and ethylene monomer during the polymerisation process of polymer (a2). "Silane group(s) containing comonomer" means herein above, below or in claims that the silane group(s) containing units (b) are present as a comonomer.

The silane group(s) containing unit (b) or, preferably, the silane group(s) containing comonomer, of polymer (a), is preferably a hydrolysable unsaturated silane compound represented by the formula (I):

$$R1SiR2_qY_{3-q} \quad (I)$$

wherein
R1 is an ethylenically unsaturated hydrocarbyl, hydrocarbyloxy or (meth)acryloxy hydrocarbyl group,
each R2 is independently an aliphatic saturated hydrocarbyl group,
Y which may be the same or different, is a hydrolysable organic group and
q is 0, 1 or 2.

Further suitable silane group(s) containing unit, preferably comonomer, is e.g. gamma-(meth)acryl-oxypropyl trimethoxysilane, gamma(meth)acryloxypropyl triethoxysilane, and vinyl triacetoxysilane, or combinations of two or more thereof.

One suitable subgroup of silane compound of formula (I) is an unsaturated silane compound or, preferably, comonomer of formula (II)

$$CH2=CHSi(OA)_3 \quad (II)$$

wherein each A is independently a hydrocarbyl group having 1-8 carbon atoms, suitably 1-4 carbon atoms.

When the silane group(s) containing units (b) are incorporated to the final polymer (a) as a comonomer, preferably as a comonomer of formula (I), preferably of formula (II), then the unsaturation, preferably vinyl functionality, of said comonomer is incorporated into the polymer via radical polymerisation process, whereby two C atoms of said comonomer become part of the backbone of the final polymer (a), as well known to a skilled person. Whereas in grafting, the polymer (a) is first polymerised to a polymer and then the silane group(s) containing units (b), preferably as a silane compound of formula (I), preferably of formula (II), are incorporated to the polymer backbone by grafting using typically peroxide, whereby only one of the C atoms of the vinyl unsaturation is attached to the final polymer backbone, as well known to a skilled person. Therefore the branch resulting from copolymerization of the silane group(s) containing units (b) as comonomer is one carbon atom shorter compared to the branch formed by grafting of the silane group(s) containing units (b), as evident for a skilled person in the polymer filed. This will have the implication that the grafted silane group(s) containing units (b) extend further out from the polymer backbone and become more accessible for crosslinking reaction than the branch which is obtained by copolymerizing the silane group(s) containing units (b) to the backbone of polymer (a).

Moreover, the copolymerisation of the silane group(s) containing units as a comonomer into the polymer backbone provides more uniform incorporation of the units compared to grafting of the units. The copolymerized silane groups is distributed depending on the reactivity ratio between silane, ethylene and other monomer while the grafting process is providing a polymer where the silane groups cannot be incorporated with any controlled distribution. In other words, when the silane group(s) containing units are incorporated as a comonomer to the polymer backbone of the polyolefin copolymer, preferably of the polyethylene copolymer, then the formed copolymer is a uniform "random copolymer" which term has a well-known meaning compared to more uneven distribution of the grafted silane group(s) containing units. Furthermore, compared to grafting, the copolymerisation does not require the addition of peroxide after production of the polymer.

The silane group(s) containing unit (b), or preferably, the silane group(s) containing comonomer, of the invention, is preferably the compound of formula (II) which is vinyl trimethoxysilane, vinyl bismethoxyethoxysilane, vinyl triethoxysilane, more preferably vinyl trimethoxysilane or vinyl triethoxysilane, more preferably vinyl trimethoxysilane, comonomer.

The amount (mol %) of the silane group(s) containing units (b) present, preferably present as comonomer, in the polymer (a) is preferably of 0.01 to 2.0 mol %, preferably 0.01 to 1.00 mol %, suitably from 0.05 to 0.80 mol %, suitably from 0.10 to 0.60 mol %, suitably from 0.10 to 0.50 mol %, when determined according to "Comonomer contents" as described below under "Determination Methods".

In one embodiment (A1) of the polymer (a), the polymer (a) is a polymer of ethylene which bears silane group(s) containing comonomer (a1). In this embodiment (A1) of the polymer (a), the polymer (a1) does not contain, i.e. is without, a polar comonomer as defined for polymer (a2). Preferably the silane group(s) containing comonomer is the sole comonomer present in the polymer (a1). Accordingly, the polymer (a1) is preferably produced by copolymerising ethylene monomer in a high pressure polymerization process in the presence of silane group(s) containing comonomer using a radical initiator. Preferably the silane group(s) containing comonomer is the only comonomer present in the polymer of ethylene (a1).

In said one preferable embodiment (A1) of the polymer (a), the polymer (a1) is preferably a copolymer of ethylene with silane group(s) containing comonomer according to formula (I), more preferably with silane group(s) containing comonomer according to formula (II), more preferably with silane group(s) containing comonomer according to formula (II) selected from vinyl trimethoxysilane, vinyl bismethoxyethoxysilane, vinyl triethoxysilane or vinyl trimethoxysilane comonomer, as defined above or in claims. Most preferably the polymer (a1) is a copolymer of ethylene with vinyl trimethoxysilane, vinyl bismethoxyethoxysilane, vinyl triethoxysilane or vinyl trimethoxysilane comonomer, preferably with vinyl trimethoxysilane or vinyl triethoxysilane comonomer, most preferably vinyl trimethoxysilane comonomer.

In another embodiment (A2) of the polymer (a), the polymer (a) is a copolymer of ethylene with one or more polar comonomer(s) selected from (C1-C6)-alkyl acrylate or (C1-C6)-alkyl (C1-C6)-alkylacrylate comonomer(s) (a2), which copolymer (a2) bears silane group(s) containing units. In this embodiment (A2) of the polymer (a) the polymer (a2) is a copolymer of ethylene with one or more, preferably one, polar comonomer(s) selected from (C1-C6)-alkyl acrylate or (C1-C6)-alkyl (C1-C6)-alkylacrylate comonomer(s) and silane group(s) containing comonomer. Preferably, the polar comonomer of the polymer of ethylene (a2) is selected from one of (C1-C6)-alkyl acrylate comonomer, preferably from methyl acrylate, ethyl acrylate or butyl acrylate comonomer. More preferably, the polymer (a2) is a copolymer of ethylene with a polar comonomer selected from methyl acrylate, ethyl acrylate or butyl acrylate comonomer and with silane group(s) containing comonomer. The polymer (a2) is most preferably a copolymer of ethylene with a polar comonomer selected from methyl acrylate, ethyl acrylate or butyl acrylate comonomer and with silane group(s) containing comonomer of compound of formula (I). Preferably, in this embodiment the polar comonomer and the preferable silane group(s) containing comonomer are the only comonomers present in the copolymer of ethylene (a2).

In another embodiment (A3) of the polymer (a), the polymer (a) is the polymer (a3) which preferably is a polymer of ethylene with one or more, preferably one, comonomer(s) selected from (C1-C8)-alpha-olefin comonomer.

Most preferably the polymer (a) is selected from polymer (a1) or (a2).

The content of the polar comonomer present in the polymer (a2) is preferably of 0.5 to 30.0 mol %, 2.5 to 20.0 mol %, preferably of 4.5 to 18 mol %, preferably of 5.0 to 18.0 mol %, preferably of 6.0 to 18.0 mol %, preferably of 6.0 to 16.5 mol %, more preferably of 6.8 to 15.0 mol %, more preferably of 7.0 to 13.5 mol %, when measured according to "Comonomer contents" as described below under the "Determination methods".

In said another preferable embodiment (A2) of the polymer (a), the polymer (a2) is preferably a copolymer of ethylene with the polar comonomer, as defined above, below or in claims, and with silane group(s) containing comonomer according to formula (I), more preferably with silane group(s) containing comonomer according to formula (II), more preferably with silane group(s) containing comonomer according to formula (II) selected from vinyl trimethoxysilane, vinyl bismethoxyethoxysilane, vinyl triethoxysilane or vinyl trimethoxysilane comonomer, as defined above or in claims. Preferably the polymer (a2) is a copolymer of ethylene with methyl acrylate, ethyl acrylate or butyl acrylate comonomer and with vinyl trimethoxysilane, vinyl bismethoxyethoxysilane, vinyl triethoxysilane or vinyl trimethoxysilane comonomer, preferably with vinyl trimethoxysilane or vinyl triethoxysilane comonomer. More preferably the polymer (a2) is a copolymer of ethylene with methyl acrylate comonomer and with vinyl trimethoxysilane, vinyl bismethoxyethoxysilane, vinyl triethoxysilane or vinyl trimethoxysilane comonomer, preferably with vinyl trimethoxysilane or vinyl triethoxysilane comonomer more preferably with vinyl trimethoxysilane. Accordingly, the polymer (a2) is most preferably a copolymer of ethylene with methyl acrylate comonomer together with silane group(s) containing comonomer as defined above, below or in claims, preferable a copolymer of ethylene with methyl acrylate comonomer and with vinyl trimethoxysilane or vinyl triethoxysilane comonomer, preferably with methyl acrylate comonomer and with vinyl trimethoxysilane comonomer.

Without binding to any theory, methyl acrylate (MA) is the only acrylate which cannot go through the ester pyrolysis reaction, since does not have this reaction path. Therefore, the polymer (a2) with MA comonomer does not form any harmful acid (acrylic acid) degradation products on the polymer backbone at high temperatures, whereby polymer (a2) of ethylene and methyl acrylate comonomer contribute to good quality and life cycle of the end article thereof. This is not the case e.g. with vinyl acetate units of EVA, since EVA forms harmful acetic acid degradation products at high temperatures. Moreover, the other acrylates like ethyl acrylate (EA) or butyl acrylate (BA) can go through the ester pyrolysis reaction, and if degrade, could form volatile olefinic by-products and result in an acidic group on the polymer backbone.

The polymer (a) present in the at least one layer of the layer element (LE), enables, if desired, to decrease the MFR of the polymer (a) compared to prior art and thus offers higher resistance to flow during the production of the preferable layer element (LE) of the invention. As a result, the preferable MFR can further contribute, if desired, to the quality of the layer element (LE), and to an article thereof comprising the layer element (LE).

The melt flow rate, MFR2, of the polymer composition, preferably of polymer (a), is preferably less than 20 g/10 min, preferably less than 15 g/10 min, preferably from 0.1 to 13 g/10 min, preferably from 0.2 to 10 g/10 min, preferably from 0.3 to 8 g/10 min, more preferably from 0.4 to 6, g/10 min (according to ISO 1133 at 190° C. and at a load of 2.16 kg).

The preferable MFR of the polymer composition, preferably of the polymer (a) can further contribute, if desired, to the quality of the preferable layer element (LE), to an article, preferably to an article comprising the preferable layer element (LE), of the invention. Moreover, the polymer (a) of the invention can have, if desired, low MFR, for instance lower MFR than that conventionally used in the field of photovoltaic (PV) modules, since the polymer (a) has advantageous flowability and processability properties combined with highly feasible adhesion properties.

The composition, preferably the polymer (a), preferably has a melting temperature, Tm, of 120° C. or less, preferably 110° C. or less, more preferably 100° C. or less and most preferably 95° C. or less, when measured according to ASTM D3418 as described under "Determination Methods". Preferably the melting temperature of the composition, more preferably the polymer (a) is 70° C. or more, more preferably 75° C. or more, even more preferably 78° C. or more, when measured as described below under "Determination Methods". The preferable melting temperature is beneficial for instance for a lamination process of the preferable layer element (LE) of the invention, since the time of the melting/softening step can be reduced.

Typically, and preferably, the density of the composition, preferably of the polymer (a), of the interlayer element is higher than 860 kg/m3. Preferably the density is not higher than 970 kg/m3, and preferably is from 920 to 960 kg/m3, according to ISO 1872-2 as described below under "Determination Methods".

Preferred polymer (a) is a polymer of ethylene (a1) with vinyl trimethoxysilane comonomer or a copolymer of ethylene (a2) with methylacrylate comonomer and with vinyl trimethoxysilane comonomer.

More preferred polymer (a) is polymer (a2). The most preferred polymer (a) is a copolymer of ethylene (a2) with methylacrylate comonomer and with vinyl trimethoxysilane comonomer.

If desired in the embodiment, wherein the polymer (a), preferably the polymer (a1) or polymer (a2), preferably polymer composition which contains silane group(s) containing units (b) as defined above below or in claims, of the polymeric layer element (LE) can be crosslinked with a silanol condensation catalyst (SCC), which is preferably selected from the group C of carboxylates of metals, such as tin, zinc, iron, lead and cobalt; from a titanium compound bearing a group hydrolysable to a Brönsted acid (preferably as described in WO 2011160964 of Borealis, included herein as reference), from organic bases; from inorganic acids; and from organic acids; suitably from carboxylates of metals, such as tin, zinc, iron, lead and cobalt, from titanium compound bearing a group hydrolysable to a Brönsted acid as defined above or from organic acids, suitably from dibutyl tin dilaurate (DBTL), dioctyl tin dilaurate (DOTL), particularly DOTL; titanium compound bearing a group hydrolysable to a Brönsted acid as defined above; or an aromatic organic sulphonic acid, which is suitably an organic sulphonic acid which comprises the structural element:

$$Ar(SO3H)x \quad (II)$$

wherein Ar is an aryl group which may be substituted or non-substituted, and if substituted, then suitably with at least one hydrocarbyl group up to 50 carbon atoms, and x is at least 1; or a precursor of the sulphonic acid of formula (II) including an acid anhydride thereof or a sulphonic acid of formula (II) that has been provided with a hydrolysable protective group(s), e.g. an acetyl group that is removable by hydrolysis. Such organic sulphonic acids are described e.g. in EP736065, or alternatively, in EP1309631 and EP1309632.

If present, then he amount of the silanol condensation catalyst (SCC), is typically 0.00001 to 0.1 mol/kg polymer composition preferably 0.0001 to 0.01 mol/kg polymer composition, more preferably 0.0005 to 0.005 mol/kg polymer composition. The choice of the SCC and the feasible amount thereof depends on the end application and is well within the skills of a skilled person.

In a preferred embodiment of the process of the invention, the polymer (a), preferably the polymer composition, of the polymeric layer is not crosslinked before introducing to the lamination process, during the lamination process or after the lamination process using a silanol condensation catalyst (SCC), which is selected from the group of carboxylates of tin, zinc, iron, lead or cobalt or aromatic organic sulphonic acids, preferably from the above preferable SCC according to group C, or electronic beam irradiation.

More preferably, also the layer element(s) which is/are in direct contact with the polymeric layer of the laminate are without a crosslinking agent selected silanol condensation catalyst (SCC), which is selected from the group of carboxylates of tin, zinc, iron, lead or cobalt or aromatic organic sulphonic acids, preferably from the above preferable SCC according to group C.

More preferably, the polymer (a), preferably polymer (a1) or polymer (a2), preferably the polymer composition, of the polymeric layer of the invention is not crosslinked with crosslinking agent selected from peroxide or silane condensation catalyst (SCC), which is selected from the SCC group of carboxylates of tin, zinc, iron, lead or cobalt or aromatic organic sulphonic acids, preferably from the SCC according to group C, as defined above or in claims, before or during, preferably before, during or after the lamination process.

It is preferred that the polymeric layer of the multilayer laminate is not crosslinked with the crosslinking agent, as defined above, before introducing to or during the lamination process, or before or during the use of the multilayer laminate in the end application.

The polymer composition comprising the polymer (a) and the silane group(s) containing units (b), more preferably the polymer (a1) or (a2), thus enables to decrease the MFR of the polymer (a), preferably polymer (a1) or (a2), compared to prior art and thus offers higher resistance to flow under pressing step (iii) and/or (iv) recovering step. As a result, the preferable MFR can further contribute, if desired, to the quality of the final multilayer laminate, such as the preferable final PV module, and to the short lamination cycle time obtainable by the process of the invention.

The polymer composition comprising the polymer (a) and the silane group(s) containing units (b), more preferably the polymer (a1) or (a2), present in the polymeric layer has preferably a Shear thinning index, $SHI_{0.05/300}$, of 30.0 to 100.0, preferably of 40.0 to 80.0, when measured according to "Rheological properties: Dynamic Shear Measurements (frequency sweep measurements)" as described below under "Determination Methods".

The preferable SHI range further contributes to the lamination process, e.g. the lamination process of a photovoltaic module laminate of the invention, since such preferable rheology property causes less stress on the PV cell element. Furthermore, the preferable rheology property contributes to the option to use lower melt flow rate, MFR, if desired. The preferable SHI thus further contributes to the quality of the final multilayer laminate, such as of the preferable final PV module, and to the short lamination cycle time of the process of the invention.

Furthermore, the combination of the preferable SHI and the preferable low MFR of the polymer composition, preferably of the polymer (a), more preferably the polymer (a1) or (a2), further contributes to a desirable high zero shear rate viscosity of the polymer composition, thereby further contributes to the reduction or prevention of the flow out of the material during lamination. And in this preferable embodiment the melt of said polymer (a), more preferably the polymer (a1) or (a2), further contributes to a proper wetting of various interfaces (layer elements) within the laminate. Accordingly, the combination of the preferable SHI and the preferable MFR range of the polymer composition, preferably of the polymer (a), more preferably the polymer (a1) or (a2), further contributes to the quality of the final multilayer laminate, such as of the preferable final PV module, and to the short lamination cycle time of the process of the invention.

As already mentioned, with the present preferable polymer composition the crosslinking of the polymeric layer element (LE) with peroxide or SCC catalyst during the lamination process can be avoided, which contributes to achieve the good quality to the final multilayer laminate. Additionally, the lamination cycle time can be shortened without deteriorating the quality of the formed multilayer laminate. For instance, the recovering step (iv) of the process can be short, since time consuming removal of by-products, which are typically formed in the prior art peroxide crosslinking, is not needed.

As said, it is preferred that the polymeric layer (LE) is not subjected to any peroxide cross-linking agent or silanol condensation catalyst (SCC) as defined above before or during, preferably before, during or after, the lamination process of the invention.

It is to be understood that the peroxide or SCC as defined above are those conventionally supplied for the purpose of crosslinking.

The polymer composition which is crosslinked for instance using the above crosslinking agents has a typical network, i.a. interpolymer crosslinks (bridges), as well known in the field. The crosslinking degree may vary depending on the end application.

It is preferred that the polymer (a) of the polymeric layer element (LE) is other than crosslinked EVA, preferably the polymer (a) is other than EVA.

Accordingly, in one embodiment the polymer composition of the polymeric layer element (LE) of the invention suitably comprises additives other than fillers (like flame retardants (FRs)). Then the polymer composition comprises, preferably consists of, based on the total amount (100 wt %) of the polymer composition, 90 to 99.9999 wt % of the polymer (a)
0.01 to 1.00 mol % silane group(s) containing units (b) and
suitably 0.0001 to 10 wt % of the additives.

The total amount of optional additives is suitably between 0.0001 and 5.0 wt %, like 0.0001 and 2.5 wt %.

The optional additives are e.g. conventional additives suitable for the desired end application and within the skills of a skilled person, including without limiting to, preferably at least antioxidant(s) and UV light stabilizer(s), and may also include metal deactivator(s), nucleating agent(s), clarifier(s), brightener(s), acid scavenger(s), as well as slip agent(s) or talc etc. Each additive can be used e.g. in conventional amounts, the total amount of additives present in the polymer composition being preferably as defined above. Such additives are generally commercially available and are described, for example, in "Plastic Additives Handbook", 5th edition, 2001 of Hans Zweifel.

In another embodiment the polymer composition of the polymeric layer element (LE) of the invention comprises in addition to the suitable additives as defined above also fillers, such as pigments, FRs with flame retarding amounts or carbon black. Then the polymer composition of the invention comprises, preferably consists of, based on the total amount (100 wt %) of the polymeric layer element (LE), 90 to 99.9999 wt %, suitably 40 to 70 wt %, of the polymer (a)
0.01 to 1.00 mol % silane group(s) containing units (b) and
up to 70 wt %, suitably 30 to 60 wt %, of additives and filler(s).

As non-limiting examples, the optional filler(s) comprise Flame Retardants, such as magensiumhydroxide, ammonium polyphosphate etc.

In the preferred embodiment the polymer composition comprises, preferably consists of, 30 to 90 wt %, suitably 40 to 70 wt %, of the polymer (a)
0.01 to 1.00 mol % silane group(s) containing units (b) and
0.0001 to 10 wt % additives and optionally fillers, preferably 0.0001 to 10 wt % additives.

In a preferable embodiment the polymer composition of the polymeric layer element (LE) consists of the polymer (a) as the only polymeric component(s). "Polymeric component(s)" exclude herein any carrier polymer(s) of optional additive or filler product(s), e.g. master batche(s) of additive(s) or, respectively, filler(s) together with the carrier polymer, optionally present in the polymer composition of the polymeric layer. Such optional carrier polymer(s) are calculated to the amount of the respective additive or, respectively, filler based on the amount (100%) of the polymer composition of the polymeric layer.

It is preferred that at least one layer of the polymeric layer element (LE) consists of the polymer composition of the invention.

The polymer (a) of the polymer composition of the polymeric layer element (LE) can be e.g. commercially available or can be prepared according to or analogously to known polymerization processes described in the chemical literature.

In a preferable embodiment the polymer (a), preferably the polymer (a1) or (a2), is produced by polymerising ethylene suitably with silane group(s) containing comonomer (=silane group(s) containing units (b)) as defined above and optionally with one or more other comonomer(s) in a high pressure (HP) process using free radical polymerization in the presence of one or more initiator(s) and optionally using a chain transfer agent (CTA) to control the MFR of the polymer. The HP reactor can be e.g. a well known tubular or autoclave reactor or a mixture thereof, suitably a tubular reactor. The high pressure (HP) polymerisation and the adjustment of process conditions for further tailoring the other properties of the polymer depending on the desired end application are well known and described in the literature, and can readily be used by a skilled person. Suitable polymerisation temperatures range up to 400° C., suitably from 80 to 350° C. and pressure from 70 MPa, suitably 100 to 400 MPa, suitably from 100 to 350 MPa. The high pressure polymerization is generally performed at pressures of 100 to 400 MPa and at temperatures of 80 to 350° C. Such processes are well known and well documented in the literature and will be further described later below.

The incorporation of the comonomer(s), if present, and optionally, and preferably, the silane group(s) containing units (b) suitably as comonomer as well as comonomer(s) and the control of the comonomer feed to obtain the desired final content of said comonomers and of optional, and preferable, silane group(s) containing units (b) as the comonomer can be carried out in a well known manner and is within the skills of a skilled person.

Further details of the production of ethylene (co)polymers by high pressure radical polymerization can be found i.a. in the Encyclopedia of Polymer Science and Engineering, Vol. 6 (1986), pp 383-410 and Encyclopedia of Materials: Science and Technology, 2001 Elsevier Science Ltd.: "Polyethylene: High-pressure, R. Klimesch, D. Littmann and F.-O. Mähling pp. 7181-7184.

Such HP polymerisation results in a so called low density polymer of ethylene (LDPE), herein with the optional (polar) comonomer as defined above or in claims and with optional, and preferable silane group(s) containing comonomer as the silane group(s) containing units (b). The term LDPE has a well known meaning in the polymer field and describes the nature of polyethylene produced in HP, i.e. the typical features, such as different branching architecture, to distinguish the LDPE from PE produced in the presence of an olefin polymerisation catalyst (also known as a coordination catalyst). Although the term LDPE is an abbreviation for low density polyethylene, the term is understood not to limit the density range, but covers the LDPE-like HP polyethylenes with low, medium and higher densities.

Lamination Process of the Invention

The substrate element and the polymeric layer element (LE) are typically premade separately before assembling thereof to a form of multilaminate assembly. The premade substrate element and the premade polymeric layer element (LE) can be produced using conventional processes. Typically the polymeric layer element (LE) is produced by cast extrusion (e.g. in case of a polymeric monolayer element) or by coextrusion (e.g. in case of a polymeric multilayer element). The coextrusion can be carried out by cast extrusion or by blown film extrusion which both are very well known processes in the film production field and within the skills of a skilled person.

The thickness of the premade substrate element and the premade polymeric layer element (LE), as well as any additional elements, of the multilayer laminate can vary depending on the desired end application and can be chosen accordingly by a person skilled in the field. The following process conditions apply to the process for producing the multilayer laminate and to the preferable process for producing the photovoltaic module of the invention.

The lamination process is carried out in a laminator equipment which can be e.g. any conventional laminator which is suitable for the multilaminate to be laminated. The choice of the laminator is within the skills of a skilled person. Typically the laminator comprises a chamber wherein the heating, optional, and preferable, evacuation, pressing and recovering (including cooling) steps (ii)-(v) take place.

The lamination process is typically provided with means to monitor and control the pressure subjected on the multilayer assembly, as well known in lamination process and equipment field. Thus typically the laminator provides means for setting the pressure profile desired to be subjected on multilayer assembly during the pressure build up step (iii) and the pressure holding step (iv).

Accordingly, the pressure used in the pressure holding step (iv) is kept at pressure of 790 mbar or less. Preferably, the pressure holding step (iv) is preferably kept at pressure of 0 to 790, 0 to 700, preferably 0 to 650, preferably 0 to 600, preferably 0 to 550, preferably 0 to 550, preferably 0 to 500, preferably 0 to 450, mbar. In another preferred embodiment of the present invention the pressure in the pressure holding step (iv) is kept in the range from 0 to 440 mbar, preferably from 50 to 420 mbar and more preferably from 190 to 410 mbar. The above preferable definitions mean that at the end of the pressure holding step (iv) the pressure can be reduced to be 0 mbar before the recovery step (v).

Another preferred embodiment of the present invention stipulates that the pressure in the pressure holding step (iv) is varied, this means two ore more different pressures in the ranges given above can be applied. It is for example preferred to apply a pressure of 500 mbar for 10 to 15 minutes and afterwards to continue heating at a pressure of 0 mbar for 1 to 5 minutes before carrying out recovering step (v).

The pressure build up step (iii) is preferably started when the at least one polymeric layer element (LE) reaches a temperature which is 3 to 10° C. higher than the melting temperature of the polymer (a), preferably of the polymer (a1) or (a2), of said polymeric layer element (LE).

The pressure build up step (iii) is preferably started when the at least one polymeric layer element (LE) reaches a temperature of at least of 85° C., suitably to 85 to 150, suitably to 85 to 148,° C.

The duration of the heating step (ii) is preferably 0.5 to 7 minutes, preferably 1 to 6 minutes, suitably 1.5 to 5 minutes. The heating step (ii) can be and is typically done step-wise.

The duration of the pressure build up step (iii) is preferably 0.01 to 10 minutes, preferably 0.01 to 5, preferably 0.01 to 3, minutes. The pressure build up step (iii) can be done either in one step or can be done in multiple steps.

The duration of the pressure holding step (iv) is preferably 0.5 to 20, preferably 0.7 to 15, minutes.

Preferably, the sum of the duration of the pressure build up step (iii) and the pressure holding step (iv) is preferably 0.5 to 20, preferably 0.5 to 18, preferably 0.5 to 15, minutes.

The sum of the duration of the heating step (ii), pressure build up step (iii) and pressure holding step (iv) is preferably less than 25, preferably from 2 to 22, preferably 5 to 22, minutes.

The lamination process of the invention can be used for producing a PV module, construction element, safety glass for buildings or vehicles, etc.

The process of the invention is preferably for producing a multilayer laminate which comprises a first substrate element, one or more polymeric layer element (LE) and a second substrate element.

Lamination Process of the Invention for Producing PV Module

The lamination process according to invention is preferably for producing a multilayer laminate which is a photovoltaic (PV) module, comprising, in the given order, a protective front layer element, preferably a front glass layer element, a front encapsulation layer element, a photovoltaic element, a rear encapsulation layer element and a protective back layer element;

wherein
  any one or more of the front encapsulation layer element, rear encapsulation layer element or protective back layer element, suitably one or both of the front encapsulation layer element or the rear encapsulation layer element, preferably both the front encapsulation layer element and the rear encapsulation layer element, is/are said polymeric layer element (LE)(s);
  the protective front layer element is said first substrate element; and
  the protective back layer element is said second substrate element.

The at least one polymeric layer can be a monolayer or a multilayer element. In case of front and/or rear encapsulation layer element are as the polymeric layer (LE), then said encapsulation layer element(s) is/are preferably said polymeric monolayer element(s). If both front encapsulation layer element and rear encapsulation layer element are of polymeric material, then the polymeric material in front and rear encapsulation layer elements can be same or different, for instance the same.

The first substrate of the multilayer laminate, preferably protective front layer element of a PV module, is preferably a glass layer element which can be any suitable glass layer material, e.g. a glass layer type conventionally used in the desired end application, like in PV module field.

The protective back layer element is also known as "backsheet layer element". Both terms are used herein below.

Backsheet layer element can be a polymeric or non-polymeric and flexible or rigid layer element. Polymeric backsheet layer element can be mono- or multilayer element and comprises at least one polymeric layer. Rigid backsheet layer element can be mono- or multilayer element and comprises at least one rigid layer. Glass layer is an example of rigid backsheet layer element.

Backsheet layer element can also represent a substrate element or a polymeric layer element (LE) of the process of the invention. The backsheet layer element is preferably a substrate element which can be rigid or flexible. The backsheet layer element is most preferably a polymeric backsheet layer element.

The "photovoltaic element" means that the element has photovoltaic activity. The photovoltaic element can be e.g. an element of photovoltaic cell(s), which has a well known meaning in the art. Silicon based material, e.g. crystalline silicon, is a non-limiting example of materials used in photovoltaic cell(s). Crystalline silicon material can vary with respect to crystallinity and crystal size, as well known to a skilled person. Alternatively, the photovoltaic element can be a substrate layer on one surface of which a further layer or deposit with photovoltaic activity is subjected, for example a glass layer, wherein on one side thereof an ink material with photovoltaic activity is printed, or a substrate layer on one side thereof a material with photovoltaic activity is deposited. For instance, in well-known thin film solutions of photovoltaic elements e.g. an ink with photovoltaic activity is printed on one side of a substrate, which is typically a glass substrate.

The photovoltaic element is most preferably an element of photovoltaic cell(s). "Photovoltaic cell(s)" means herein a layer element(s) of photovoltaic cells together with connectors.

The PV module may comprise other layer elements as well, as known in the field of PV modules. Moreover, any of the other layer elements can be mono or multilayer elements.

In some embodiments there can be an adhesive layer between the different layer elements and/or between the layers of a multilayer element, as well known in the art. Such adhesive layer has the function to improve the adhesion between the two elements and have a well known meaning in the lamination field. The adhesive layers are differentiated from the other functional layer elements of the PV module, e.g. those as specified above, below or in claims, as evident for a skilled person in the art.

All the above elements of the photovoltaic module have a well known meaning. The protective front layer element, preferably a front glass layer element, a front encapsulation layer element, a photovoltaic element, a rear encapsulation layer element and a backsheet layer element other than the polymeric layer element (LE) of the invention can be produced in a manner well known in the photovoltaic field or are commercially available.

The polymer composition of the polymeric layer element (LE) of the invention, as well as any of the above elements, can be commercially available or be produced as defined above under "Polymer (a) and the silane group(s) containing units (b) of the at least one polymeric layer of the multilayer laminate".

As well known in the PV field, the thickness of the above mentioned elements, as well as any additional elements, of the laminated photovoltaic module of the invention can vary depending on the desired photovoltaic module embodiment and can be chosen accordingly by a person skilled in the PV field.

As a non-limiting example only, the thickness of the front and back encapsulation monolayer or multilayer element is typically up to 2 mm, preferably up to 1 mm, typically 0.3 to 0.6 mm.

As a non-limiting example only, the thickness of the rigid protective front layer element, e.g. glass layer, is typically up to 10 mm, preferably up to 8 mm, preferably 2 to 4 mm. As a non-limiting example only, the thickness of the flexible protective front layer element, e.g. polymeric (multi)layer element, is typically up to 700, like 90 to 700, suitably 100 to 500, such as 100 to 400, µm.

As a non-limiting example only, the thickness of the flexible protective back (backsheet) layer element, e.g. polymeric (multi)layer element, is typically up to 700, like 90 to 700, suitably 100 to 500, such as 100 to 400, µm. The flexible protective (backsheet) layer element is typically a polymeric mono or multilayer element.

As a non-limiting example only, the thickness of the rigid protective back (backsheet) layer element, e.g. glass layer, is typically up to 10 mm, preferably up to 8 mm, preferably up to 4 mm, preferably 2 to 4 mm.

As a non-limiting example only, the thickness of a photovoltaic element, e.g. an element of monocrystalline photovoltaic cell(s), is typically between 100 to 500 microns.

It is also to be understood that part of the elements can be in integrated form, i.e. two or more of said PV elements can be integrated together, preferably by lamination, before the elements of the assembly step (i) are introduced to said step (i).

Accordingly, the process is preferably a process as defined above, below or in claims for producing a photovoltaic (PV) module comprising, in the given order, a protective front layer element, a front encapsulation layer element, a photovoltaic element, a rear encapsulation layer element and a protective back layer element; wherein at least one of the front encapsulation layer element or the rear encapsulation layer element, or both the front encapsulation layer element and the rear encapsulation layer element, comprise(s) a polymer composition comprising:
  (a) a polymer, wherein said polymer (a) optionally bears functional group(s) containing units; and
  (b) silane group(s) containing units;
and wherein the process comprises the steps of:
(i) assembling step to arrange the protective front layer element, the front encapsulation layer element, the photovoltaic element, the rear encapsulation layer element and the protective back layer element, in given order, to form of a photovoltaic module assembly;
(ii) heating step to heat up the photovoltaic module assembly optionally, and preferably, in a chamber at evacuating conditions;
((iii) pressure build up step, where the pressure on the multilayer assembly is gradually increased in a single or multiple steps;
(iv) pressure holding step, where the pressure is kept on the multilayer assembly at the heated conditions for the lamination of the assembly to occur; and
(v) recovering step to cool and remove the obtained multilayer laminate for later use;
  wherein the pressure during pressure holding step (iv) is kept at 790 mbar or below.

The above preferable conditions and durations as defined above under "Lamination process of the invention" apply, naturally, for the lamination process of the PV module laminate as well.

The invention further provides a multilayer laminate, preferably a photovoltaic (PV) module, obtainable by, preferably produced by, the process of the invention.

The invention further provides a multilayer laminate, preferably a photovoltaic (PV) module, obtainable by, preferably produced by, the process of the invention, wherein average thickness variation of the multilayer laminate is 60% or less, preferably 0 to 50%, preferably 0 to 40%, preferably 0 to 38%, whereby the average thickness variation (%) means the average of the thickness variation of two opposite edges of the multilayer laminate as defined and calculated under "Determination methods".

The invention further provides a photovoltaic (PV) module comprising, in the given order, a protective front layer element, a front encapsulation layer element, a photovoltaic element, a rear encapsulation layer element and a protective back layer element;
wherein any one or more of the front encapsulation layer element, rear encapsulation layer element or protective back layer element, suitably one or both of the front encapsulation layer element or the rear encapsulation layer element, preferably both the front encapsulation layer element and the rear encapsulation layer element, is/are said polymeric layer element(s) (LE)(s); comprising a polymer composition comprising
(a) a polymer, as defined above or in claims; and
wherein average thickness variation of the photovoltaic (PV) module is 60% or less, preferably 0 to 50%, preferably 0 to 40%, preferably 0 to 38%, whereby the average thickness variation (%) means the average of the thickness variation of two opposite edges of the PV module as calculated as described in the under "Determination methods".

Determination Methods

Unless otherwise stated in the description or in the experimental part, the following methods were used for the property determinations of the polymer composition, polar polymer and/or any sample preparations thereof as specified in the text or experimental part.

Melt Flow Rate

The melt flow rate (MFR) is determined according to ISO 1133 and is indicated in g/10 min. The MFR is an indication of the flowability, and hence the processability, of the polymer. The higher the melt flow rate, the lower the viscosity of the polymer. The MFR is determined at 190° C. for polyethylene. MFR may be determined at different loadings such as 2.16 kg ($MFR_2$) or 5 kg ($MFR_5$).

Density

Low density polyethylene (LDPE): The density of the polymer was measured according to ISO 1183-2. The sample preparation was executed according to ISO 1872-2 Table 3 Q (compression moulding).

Comonomer Contents:

The Content (Wt % and Mol %) of Polar Comonomer Present in the Polymer and the Content (Wt % and Mol %) of Silane Group(s) Containing Units (Preferably Comonomer) Present in the Polymer Composition (Preferably in the Polymer):

Quantitative nuclear-magnetic resonance (NMR) spectroscopy was used to quantify the comonomer content of the polymer composition or polymer as given above or below in the context.

Quantitative $^1$H NMR spectra recorded in the solution-state using a Bruker Advance III 400 NMR spectrometer operating at 400.15 MHz. All spectra were recorded using a standard broad-band inverse 5 mm probehead at 100° C. using nitrogen gas for all pneumatics. Approximately 200 mg of material was dissolved in 1,2-tetrachloroethane-$d_2$ (TCE-$d_2$) using ditertiarybutylhydroxytoluen (BHT) (CAS 128-37-0) as stabiliser. Standard single-pulse excitation was employed utilising a 30 degree pulse, a relaxation delay of 3 s and no sample rotation. A total of 16 transients were acquired per spectra using 2 dummy scans. A total of 32k data points were collected per FID with a dwell time of 60 μs, which corresponded to a spectral window of approx. 20 ppm. The FID was then zero filled to 64k data points and an exponential window function applied with 0.3 Hz line-broadening. This setup was chosen primarily for the ability to resolve the quantitative signals resulting from methylacrylate and vinyltrimethylsiloxane copolymerisation when present in the same polymer.

Quantitative $^1$H NMR spectra were processed, integrated and quantitative properties determined using custom spectral analysis automation programs. All chemical shifts were internally referenced to the residual protonated solvent signal at 5.95 ppm. When present characteristic signals resulting from the incorporation of vinylacytate (VA), methyl acrylate (MA), butyl acrylate (BA) and vinyltrimethylsiloxane (VTMS), in various comonomer sequences, were observed (Randell89). All comonomer contents calculated with respect to all other monomers present in the polymer.

The vinylacytate (VA) incorporation was quantified using the integral of the signal at 4.84 ppm assigned to the *VA sites, accounting for the number of reporting nuclei per comonomer and correcting for the overlap of the OH protons from BHT when present:

$$VA=(I_{*VA}-(I_{ArBHT})/2)/1$$

The methylacrylate (MA) incorporation was quantified using the integral of the signal at 3.65 ppm assigned to the 1MA sites, accounting for the number of reporting nuclei per comonomer:

$$MA=I_{1MA}/3$$

The butylacrylate (BA) incorporation was quantified using the integral of the signal at 4.08 ppm assigned to the 4BA sites, accounting for the number of reporting nuclei per comonomer:

$$BA=I_{4BA}/2$$

The vinyltrimethylsiloxane incorporation was quantified using the integral of the signal at 3.56 ppm assigned to the 1VTMS sites, accounting for the number of reporting nuclei per comonomer:

$$VTMS=I_{1VTMS}/9$$

Characteristic signals resulting from the additional use of BHT as stabiliser, were observed. The BHT content was quantified using the integral of the signal at 6.93 ppm assigned to the ArBHT sites, accounting for the number of reporting nuclei per molecule:

$$BHT=I_{ArBHT}/2$$

The ethylene comonomer content was quantified using the integral of the bulk aliphatic (bulk) signal between 0.00-3.00 ppm. This integral may include the 1VA (3) and αVA (2) sites from isolated vinylacetate incorporation, *MA and αMA sites from isolated methylacrylate incorporation, 1BA (3), 2BA (2), 3BA (2), *BA (1) and αBA (2) sites from isolated butylacrylate incorporation, the *VTMS and αVTMS sites from isolated vinylsilane incorporation and the aliphatic sites from BHT as well as the sites from polyethylene sequences. The total ethylene comonomer content was calculated based on the bulk integral and compensating for the observed comonomer sequences and BHT:

$$E=(¼)*[I_{bulk}-5*VA-3*MA-10*BA-3*VTMS-21*BHT]$$

It should be noted that half of the α signals in the bulk signal represent ethylene and not comonomer and that an insignificant error is introduced due to the inability to compensate for the two saturated chain ends (S) without associated branch sites. The total mole fractions of a given monomer (M) in the polymer was calculated as:

$$fM=M/(E+VA+MA+BA+VTMS)$$

The total comonomer incorporation of a given monomer (M) in mole percent was calculated from the mole fractions in the standard manner:

$$M[\text{mol \%}] = 100 * fM \quad (5)$$

The total comonomer incorporation of a given monomer (M) in weight percent was calculated from the mole fractions and molecular weight of the monomer (MW) in the standard manner:

$$M[\text{wt \%}] = 100*(fM*MW)/((fVA*86.09)+(fMA*86.09)+ \\ (fBA*128.17)+(fVTMS*148.23)+((1-fVA-fMA- \\ fBA-fVTMS)*28.05))$$

randall89: J. Randall, Macromol. Sci., Rev. Macromol. Chem. Phys. 1989, C29, 201.

If characteristic signals from other specific chemical species are observed the logic of quantification and/or compensation can be extended in a similar manor to that used for the specifically described chemical species. That is, identification of characteristic signals, quantification by integration of a specific signal or signals, scaling for the number of reported nuclei and compensation in the bulk integral and related calculations. Although this process is specific to the specific chemical species in question the approach is based on the basic principles of quantitative NMR spectroscopy of polymers and thus can be implemented by a person skilled in the art as needed.

Adhesion Test:

A laminate consisting of glass (300*30 mm), 2 encapsulant layers as given in examples and backsheet (Coveme dymat PYE SPV backsheet as supplied by Coveme) is first laminated. Between the glass and the first encapsulate film a small sheet of Teflon is inserted at one of the ends, this will generate a small part of the encapsulants and backsheet that is not adhered to the glass. This part will be used as the anchoring point for the tensile testing device.

The laminate is then cut along the laminate to form a 13 mm wide strip, the cut goes through the backsheet and the encapsulant films all the way down to the glass surface. The laminate is mounted in the tensile testing equipment and the clamp of the tensile testing device is attached to the end of the strip.

The pulling angle is 90° in relation to the laminate and the pulling speed is 50 mm/min. The pulling force is measured as the average during 50 mm of peeling starting 25 mm into the strip.

The average force over the 50 mm is divided by the width of the strip (13 mm) and presented as adhesion strength (N/cm).

Rheological Properties:

Dynamic Shear Measurements (Frequency Sweep Measurements)

The characterisation of melt of polymer composition or polymer as given above or below in the context by dynamic shear measurements complies with ISO standards 6721-1 and 6721-10. The measurements were performed on an Anton Paar MCR501 stress controlled rotational rheometer, equipped with a 25 mm parallel plate geometry. Measurements were undertaken on compression moulded plates, using nitrogen atmosphere and setting a strain within the linear viscoelastic regime. The oscillatory shear tests were done at 190° C. applying a frequency range between 0.01 and 600 rad/s and setting a gap of 1.3 mm.

In a dynamic shear experiment the probe is subjected to a homogeneous deformation at a sinusoidal varying shear strain or shear stress (strain and stress controlled mode, respectively). On a controlled strain experiment, the probe is subjected to a sinusoidal strain that can be expressed by $$\gamma(t) = \gamma_0 \sin(\omega t) \quad (1)$$

If the applied strain is within the linear viscoelastic regime, the resulting sinusoidal stress response can be given by $$\sigma(t) = \sigma_0 \sin(\omega t + \delta) \quad (2)$$

where $\sigma_0$ and $\gamma_0$ are the stress and strain amplitudes, respectively
$\omega$ is the angular frequency
$\delta$ is the phase shift (loss angle between applied strain and stress response)
t is the time Dynamic test results are typically expressed by means of several different rheological functions, namely the shear storage modulus G', the shear loss modulus, G", the complex shear modulus, G*, the complex shear viscosity, η*, the dynamic shear viscosity, η', the out-of-phase component of the complex shear viscosity if and the loss tangent, tan δ which can be expressed as follows:

$$G' = \frac{\sigma_0}{\gamma_0}\cos\delta \ [\text{Pa}] \quad (3)$$

$$G'' = \frac{\sigma_0}{\gamma_0}\sin\delta \ [\text{Pa}] \quad (4)$$

$$G^* = G' + iG'' \ [\text{Pa}] \quad (5)$$

$$\eta^* = \eta' - i\eta'' \ [\text{Pa} \cdot s] \quad (6)$$

$$\eta' = \frac{G''}{\omega} \ [\text{Pa} \cdot s] \quad (7)$$

$$\eta'' = \frac{G'}{\omega} \ [\text{Pa} \cdot s] \quad (8)$$

Besides the above mentioned rheological functions one can also determine other rheological parameters such as the so-called elasticity index EI(x). The elasticity index EI(x) is the value of the storage modulus, G' determined for a value of the loss modulus, G" of x kPa and can be described by equation (9).

$$EI(x) = G' \text{ for } (G'' = x \text{ kPa})[\text{Pa}] \quad (9)$$

For example, the EI(5 kPa) is the defined by the value of the storage modulus G', determined for a value of G" equal to 5 kPa.

Shear Thinning Index ($SHI_{0.05/300}$) is defined as a ratio of two viscosities measured at frequencies 0.05 rad/s and 300 rad/s, $\mu_{0.05}/\mu_{300}$.

REFERENCES

[1] Rheological characterization of polyethylene fractions" Heino, E. L., Lehtinen, A., Tanner J., Seppälä, J., Neste Oy, Porvoo, Finland, Theor. Appl. Rheol., Proc. Int. Congr. Rheol., 11th (1992), 1, 360-362

[2] The influence of molecular structure on some rheological properties of polyethylene", Heino, E. L., Borealis Polymers Oy, Porvoo, Finland, Annual Transactions of the Nordic Rheology Society, 1995.).

[3] Definition of terms relating to the non-ultimate mechanical properties of polymers, Pure & Appl. Chem., Vol. 70, No. 3, pp. 701-754, 1998.

Melting Temperature, Crystallization Temperature ($T_{cr}$), and Degree of Crystallinity The melting temperature Tm of the used polymers was measured in accordance with ASTM D3418. Tm and Tcr were measured with Mettler TA820 differential scanning calorimetry (DSC) on 3±0.5 mg samples. Both crystallization and melting curves were obtained during 10° C./min cooling and heating scans between −10 to 200° C. Melting and crystallization temperatures were taken as the peaks of endotherms and exotherms. The degree of crystallinity was calculated by comparison with heat of fusion of a perfectly crystalline polymer of the same polymer type, e.g. for polyethylene, 290 J/g.

Average Thickness Variation Calculation:

Laminate thickness was measured as close to the glass edge as possible (approximately 2-3 mm from glass edge). Calculation on the variation was made by comparing thickness of polymeric layer element (i.e. removing the thickness of first and second substrate element (glass) from the test laminate thickness) at corners of test laminate compared to middle of the test laminate measured from cross-section of two opposite edge sides as shown in FIG. 1. Variation expresses the thickness reduction in corners relative to middle of the polymeric layer element according to equation below.

$$\text{Variation (\%)} = \frac{\text{Laminate thickness, middle} - \text{Laminate thickness, corner}}{\text{Laminate thickness, middle} - \text{Total glass thickness}} * 100$$

The average thickness variation (%) is the average of the thickness variation of two opposite edges of the multilayer laminate as calculated from the measurement points and with the formula as given above. The average thickness variation can be calculated from any two opposite edges of e.g. a rectangular multilayer laminate.

EXPERIMENTAL PART

Preparation of Examples (Copolymer of Ethylene with Methyl Acrylate Comonomer and with Vinyl Trimethoxysilane Comonomer)

Polymerisation of the polymer (a) of inventive layer element, Inv. Ex.1-Inv.Ex2:

Inventive polymer (a) was produced in a commercial high pressure tubular reactor at a pressure 2500-3000 bar and max temperature 250-300° C. using conventional peroxide initiator. Ethylene monomer, methyl acrylate (MA) polar comonomer and vinyl trimethoxy silane (VTMS) comonomer (silane group(s) containing comonomer (b)) were added to the reactor system in a conventional manner. CTA was used to regulate MFR as well known for a skilled person. After having the information of the property balance desired for the inventive final polymer (a), the skilled person can control the process to obtain the inventive polymer (a).

The amount of the vinyl trimethoxy silane units, VTMS, (=silane group(s) containing units), the amount of MA and $MFR_2$ are given in the table 1.

The properties in below tables were measured from the polymer (a) as obtained from the reactor or from a layer sample as indicated below.

TABLE 1

| Product properties of Inventive Examples | | |
|---|---|---|
| Test polymer Properties of the polymer obtained from the reactor | Inv. Ex. 1 | Inv. Ex 2 |
| $MFR_{2.16}$, g/10 min | 2.0 | 4.5 |
| acrylate content, mol % (wt %) | MA 8.1 (21) | MA 8.6 (22) |
| Melt Temperature, ° C. | 92 | 90 |
| VTMS content, mol % (wt %) | 0.41 (1.8) | 0.38 (1.7) |

TABLE 1-continued

| Product properties of Inventive Examples | | |
|---|---|---|
| Test polymer Properties of the polymer obtained from the reactor | Inv. Ex. 1 | Inv. Ex 2 |
| Density, kg/m³ | 948 | 946 |
| SHI (0.05/300), 150° C. | 70 | 52 |

In above table 1 MA denotes the content of Methyl Acrylate comonomer present in the polymer and, respectively, VTMS content denotes the content of vinyl trimethoxy silane comonomer present in the polymer.

Lamination Examples

Test Multilayer Laminates

The structure of test laminates was first substrate element (=protective front layer element)/polymeric layer element (=front encapsulation layer element)/additional layer element (=photovoltaic cell element)/additional polymeric layer element (=rear encapsulation layer element)/second substrate element (=protective back layer element)

Materials, Laminator and Methods

Test polymer of inv.Ex.1 was used as polymeric layer elements in all test multilayer laminates laminated in different conditions as given in below table. Initial thickness of both polymeric layer element was 0.45 mm First and second substrate element: non-structured solar glass (250*180 cm) with thickness of 3.0 mm.

Additional layer element: P-type monocrystalline silicon 156*156 mm (photovoltaic (PV) cell element). The thickness of PV cell element is 0.2 mm.

Laminator: PEnergy lab laminator L036LAB

Lamination Process of the Test Laminate Elements:

Test Laminates were prepared by assembling, in given order, protective front layer element (glass) as said first substrate element, front encapsulation layer element as said polymeric layer element (polymer of inv.Ex 1), photovoltaic cell element as said additional layer element, rear encapsulation layer element as said additional polymeric layer element (polymer of inv.Ex 1) and protective back layer element (glass) as said second substrate element, to produce a test photovoltaic (PV) module sample of the preferable embodiment of the invention. All the elements had the same width and length dimensions.

Each test laminate was laminated in different conditions as given in table 2. Comparative test laminate was laminated using the same test polymer of Inv.Ex.1 as polymeric layer elements, but the pressure was higher than in Inventive test laminates (150° C., 360 s evacuation, 840 s holding at 800 mbar).

No frame or taped edges was used during lamination.

TABLE 2

| Lamination settings and conditions of test laminates: (145° C., 360 s evacuation, 840 s holding at different pressures) | |
|---|---|
| Test Laminate | Pressure [mbar] |
| Comp. test laminate 1 | 800 |
| Inv. test laminate 1 | 400 |
| Inv. test laminate 2 | 200 |

| | Lamination temp. (° C.) during pressure | Duration | Total duration |
|---|---|---|---|

TABLE 2-continued

Lamination settings and conditions of test laminates: (145° C., 360 s evacuation, 840 s holding at different pressures)

| Lamination Test no. | Heating step (ii) with Evacuation (min) | bild up step (iii) and pressure holding step (iv) | (min) of pressure holding step (iv) | (min) of steps (ii) to (iv) of the lamination process |
|---|---|---|---|---|
| Comp. Test Laminate 1 | 6.0 | 145 | 14 | 20 |
| Inv. Test Laminate 1 | 6.0 | 145 | 14 | 20 |
| Inv. Test Laminate 2 | 6.0 | 145 | 14 | 20 |

Thickness Variation Along Cross-Section of the Edges of Polymeric Layer Element of Test Laminates (Expressed as Average Thickness Variation)

Average Thickness Variation Calculation: Thickness Variation Calculation:

Laminate thickness was measured as close to the glass edge as possible (approximately 2-3 mm from glass edge). Calculation on the variation was made by comparing thickness of polymeric layer element (i.e. removing the thickness of first and second substrate element (glass) from the test laminate thickness) at corners of test laminate compared to middle of the test laminate measured from cross-section of two opposite edge sides as shown in FIG. 1.

Variation expresses the thickness reduction in corners relative to middle of the polymeric layer element according to equation below.

$$\text{Variation (\%)} = \frac{\text{Laminate thickness, middle} - \text{Laminate thickness, corner}}{\text{Laminate thickness, middle} - \text{Total glass thickness}} * 100$$

The average thickness variation (%) is the average of the thickness variation of two opposite edges of the multilayer laminate as calculated from the measurement points and with the formula as given above. The average thickness variation can be calculated from any two opposite edges of e.g. a rectangular multilayer laminate.

TABLE 3

Thickness Variation (%) measured at cornes and at middle point of cross-section of two opposite edges of Inventive test laminate 1 and 2 and of Comparative test laminate 1 and the average thickness variation (%) thereof

| Test Laminate | Pressure | Thickness variation % of TOP* edge of the test laminate (measured as shown in FIG. 1) | Thickness variation % of BOTTOM** edge of the test laminate (measured as shown in FIG. 1) | Average thickness variation % of the two opposite edges |
|---|---|---|---|---|
| Comp. test laminate 1 | 800 | 56, 67 | 69, 23 | 63 |
| Inv. test laminate 1 | 400 | 23, 42 | 47, 10 | 35 |
| Inv. test laminate 2 | 200 | 15, 79 | 23, 42 | 20 |

TOP* = edge on side of the test laminte wherein the interconnectors locate
BOTTOM** = edge on side opposite to TOP edge As seen from Table 3, the high pressure used in Comparative test laminate 1 during the pressure holding step (iv) of the lamination process has a dramatic influence on the module thickness expressed as thickness variation. The less the pressure, the less changes in the thickness of the laminate as can be seen from Inventive test laminates 1 and 2. At the upper corners, the laminate is slightly thicker due to that the 300 μm interconnectors takes space in the laminate.

Bubble Formation and Delamination of Test Laminates after Lamination

Conventionally, for instance in photovoltaic (PV) module embodiments of the present multilayer laminate of the invention, the laminated multilayer laminate, like PV module, around e.g. interconnectors that problems with bubble formation and delaminations occur.

Comparative and Inventive test laminates were visually inspected after the lamination process as well as after 625 h of damp-heat exposure at temperature of 85° C. and relative humidity (RH) of 85%.

After lamination and cooling down to ambient temperature, the visual inspection showed that Comparative test laminate 1 clearly had small bubbles and delaminations, whereas Inventive test laminate 2 and 3 had no defects.

After said 625 h of damp-heat exposure and cooling down to ambient temperature, Comparative test laminate 1 showed severe delaminations around the interconnector of the laminate, while Inventive test laminate 1 showed only minor delamination and no bubbles and Inventive Test Laminate 2 showed no delaminations and no bubbles. All results are summarised in Table 4.

TABLE 4

Visual appearance of the modules after lamination and after 625 h damp-heat exposure.

| | Comp. test laminate 1 (800 mbar) | Inv. test laminate 1 (400 mbar) | Inv. test laminate 2 (200 mbar) |
|---|---|---|---|
| After lamination | Some bubbles, no delamination | No bubbles | No bubbles |
| DH625 | Some bubbles, severe delaminations | Minor delaminations, no bubbles | No delaminations, no bubbles |

The invention claimed is:

1. A process for producing a multilayer laminate being a photovoltaic (PV) module comprising, in the given order, a protective front layer element, a front encapsulation layer element, a photovoltaic element, a rear encapsulation layer element, and a protective back layer element,
wherein any one or more of the front encapsulation layer element or rear encapsulation layer element is/are a polymeric layer element(s) (LE);
the protective front layer element is a first substrate element being a glass element; and
the protective back layer element is a second substrate element being a glass element;
wherein the polymeric layer element (LE) comprises a polymer composition comprising:
(a) a polymer;
and wherein the process comprises the steps of:
(i) assembling step to arrange the at least one substrate element and the at least one polymeric layer element (LE) in form of a multilayer assembly;
(ii) heating step to heat up the multilayer assembly;
(iii) pressure build up step, where the pressure on the multilayer assembly is gradually increased in a single or multiple steps;
(iv) pressure holding step, where the pressure is kept on the multilayer assembly at the heated conditions attained at the end of step (ii); and
(v) recovering step to cool and remove the obtained multilayer laminate for later use;
wherein the pressure during pressure holding step (iv) is kept at 790 mbar or below; and
wherein average thickness variation of the resultant multilayer laminate is 60% or less, wherein the average thickness variation (%) is the average of the thickness variation of two opposite edges of the multilayer laminate compared to the middle of the multilayer laminate.

2. The process according to claim 1, wherein the pressure holding step (iv) is kept at pressure of 700 mbar or less.

3. The process according to claim 1, wherein the duration of the pressure holding step (iv) is 0.5 to 20 minutes.

4. The process according to claim 1, wherein the pressure build up step (iii) is started when the at least one polymeric layer element (LE) reaches a temperature which is at least 3 to 10° C. higher than the melting temperature of the polymer (a) of said polymeric layer element (LE).

5. The process according to claim 1, wherein said polymer (a) is a polymer of ethylene; and
(b) silane group(s) containing units.

6. The process according to claim 1, wherein the polymer composition of the polymeric layer of the lamination process comprises:
a polymer of ethylene (a) selected from:
(a1) a polymer of ethylene which bears functional groups containing units;
(a2) a polymer of ethylene containing one or more polar comonomer(s) selected from (C1-C6)-alkyl acrylate or (C1-C6)-alkyl (C1-C6)-alkylacrylate; or
(a3) a polymer of ethylene containing one or more alpha-olefin comonomer selected from (C1-C10)-alpha-olefin comonomer; and
silane group(s) containing units (b).

7. The process according to claim 1, wherein the polymer composition comprises:
polymer (a) which is selected from:
(a1) a polymer of ethylene; or
(a2) a polymer of ethylene containing one or more polar comonomer(s) selected from (C1-C6)-alkyl acrylate or (C1-C6)-alkyl (C1-C6)-alkylacrylate comonomer(s); and
silane group(s) containing units (b).

8. The process according to claim 1, wherein the polymer composition comprises:
polymer (a) which is selected from
(a1) a polymer of ethylene; or
(a2) a polymer of ethylene containing one or more polar comonomer(s) selected from (C1-C6)-alkyl acrylate or (C1-C6)-alkyl (C1-C6)-alkylacrylate comonomer(s); and
silane group(s) containing units (b); or
wherein the polymer composition comprises:
a polymer (a) which is the polymer of ethylene (a1) which bears the silane group(s) containing units (b) as the functional groups containing units, or
the polymer composition comprises:
a polymer (a) which is the polymer of ethylene (a2) containing one or more polar comonomer(s) selected from (C1-C6)-alkyl acrylate or (C1-C6)-alkyl (C1-C6)-alkylacrylate, and bears functional group(s) containing units other than said polar comonomer; and
silane group(s) containing units (b).

9. The process according to claim 5, wherein the silane group(s) containing unit (b) is a hydrolysable unsaturated silane compound represented by the formula (I):

$$R1SiR2_qY_{3-q} \quad (I)$$

wherein
R1 is an ethylenically unsaturated hydrocarbyl, hydrocarbyloxy or (meth)acryloxy hydrocarbyl group,
each R2 is independently an aliphatic saturated hydrocarbyl group,
Y which may be the same or different, is a hydrolysable organic group and
q is 0, 1 or 2, the amount of the silane group(s) containing units (b) present in the layer is from 0.01 to 1.00 mol %, when determined via quantitative $^1$H NMR spectroscopy.

10. The process according to claim 1, wherein polymer (a) is a copolymer of ethylene (a1) with vinyl trimethoxysilane comonomer or a copolymer of ethylene (a2) with methylacrylate comonomer and with vinyl trimethoxysilane comonomer.

11. The process according to claim 1, wherein no peroxide crosslinking agent is introduced to the polymer (a) of the polymer composition before or during the lamination process.

12. The process according to claim 1, wherein the copolymer of ethylene (a) has one, more or all of the following properties
melt flow rate, $MFR_2$, of less than 20 g/10 min (according to ISO 1133 at 190° C. and at a load of 2.16 kg),
Melting temperature, Tm, of 100° C. or less when measured according to ISO 3146, and/or
Shear thinning index, $SHI_{0.05/300}$, of 30.0 to 100.0 when determined by Dynamic Shear Measurements (frequency sweep measurements).

13. A photovoltaic (PV) module obtainable by the process according to claim 1.

14. The process according to claim 5, wherein the polymer composition of the polymeric layer of the lamination process comprises:
- a polymer of ethylene (a) selected from:
  - (a1) a polymer of ethylene which contains one or more comonomer(s) other than a polar comonomer of polymer (a2) and which bears functional groups containing units;
  - (a2) a polymer of ethylene containing one or more polar comonomer(s) selected from (C1-C6)-alkyl acrylate or (C1-C6)-alkyl (C1-C6)-alkylacrylate, and bears functional group(s) containing units other than said polar comonomer; or
  - (a3) a polymer of ethylene containing one or more alpha-olefin comonomer selected from (C1-C10)-alpha-olefin comonomer; and bears functional group(s) containing units; and
- silane group(s) containing units (b).

15. The process according to claim 1, wherein no cross-linking agent selected from peroxide or silane condensation catalyst (SCC), which is selected from the SCC group of carboxylates of tin, zinc, iron, lead or cobalt or aromatic organic sulphonic acids, is introduced to the polymer (a) of the polymer composition before or during the lamination process.

16. The process according to claim 1, wherein the pressure holding step (iv) is kept at pressure of 0 to 440 mbar.

* * * * *